United States Patent
Lin

(10) Patent No.: US 7,498,886 B2
(45) Date of Patent: Mar. 3, 2009

(54) CLOCK DISTRIBUTION SYSTEM AND METHOD THEREOF

(75) Inventor: Hsiao-Chyi Lin, Taipei (TW)

(73) Assignee: Via Technologies, Inc., Taipei (TW)

( * ) Notice: Subject to any disclaimer, the term of this patent is extended or adjusted under 35 U.S.C. 154(b) by 109 days.

(21) Appl. No.: 11/611,267

(22) Filed: Dec. 15, 2006

(65) Prior Publication Data

US 2007/0176693 A1 Aug. 2, 2007

Related U.S. Application Data

(60) Provisional application No. 60/762,705, filed on Jan. 27, 2006.

(51) Int. Cl.
*H03L 7/00* (2006.01)

(52) U.S. Cl. .......................................... 331/16; 331/57

(58) Field of Classification Search .................... 331/16
See application file for complete search history.

(56) References Cited

U.S. PATENT DOCUMENTS

2006/0176118 A1\* 8/2006 Uchiyama et al. ............. 331/16
2006/0220713 A1\* 10/2006 Mughal et al. ............. 327/170

\* cited by examiner

*Primary Examiner*—Joseph Chang
(74) *Attorney, Agent, or Firm*—Thomas, Kayden, Horstemeyer & Risley

(57) ABSTRACT

A clock distribution circuit and a method thereof. The clock distribution circuit comprises a comparator, a filter, a scaling unit, and an oscillator. The comparator compares a reference signal and a feedback signal to generate an error signal. The filter is coupled to the comparator and outputs a filtered signal based on the error signal. The scaling unit is coupled to the comparator, and scales down the filtered signal by a scaling factor to form a control signal. The oscillator is coupled to the scaling unit, and produces the feedback signal based on the control signal. And the scaling factor is less than 1.

18 Claims, 7 Drawing Sheets

CLOCK DISTRIBUTION SYSTEM AND METHOD THEREOF

BACKGROUND OF THE INVENTION

1. Field of the Invention

The invention relates to a clock distribution system, and in particular to a phase-locked loop in the clock distribution system and a method thereof.

2. Description of the Related Art

A phase-locked loop (PLL) is a closed loop control system maintaining a fixed phase relationship between a generated signal and a reference signal. In high speed applications, a high-speed and low-noise PLL is required in a clock distribution system to meet clock speed requirements. For example, in a multilane system, a global clock multiplier unit (CMU) produces a transmitter clock shared by multiple lanes, and is realized by a high-speed and low-noise PLL.

FIG. 1 is a block diagram of a conventional PLL with noise sources, comprising Phase Frequency Detector/Charge Pump (PFD/CP) 10, filter 12, and Voltage Controlled Oscillator (VCO) 14. PFD/CP 10 is coupled to filter 12, and in turn coupled to VCO 14.

VCO 14 varies output frequency $f_{out1}$ in response to control voltage $V_{c1}$ and generates periodic output. If output frequency $f_{out1}$ falls behind that of the reference, PFD/CP 10 detects frequency difference therebetween, and changes control voltage $V_{c1}$ to speed output frequency $f_{out1}$ from VCO 14. Likewise, if output frequency $f_{out1}$ leads the reference, PFD/CP 10 changes control voltage $V_{c1}$ to slow down output frequency $f_{out1}$ from VCO 14. Filter 12 smoothes any abrupt change in control voltage $V_{c1}$, so that PLL system 1 tends towards a state where PFD/CP 10 makes few corrections.

As device sizes of integrated circuits are reduced, operating voltage ranges thereof decrease accordingly, yet the required frequency ranges increase. Therefore VCO gain $K_{VCO}$ of the VCO 14 is increased to cover the required frequency range in the limited voltage range. The process, voltage, and temperature (PVT) variation in integrated circuits further introduces a need for higher VCO gain $K_{VCO}$. FIG. 2 shows a control voltage $V_{c1}$ and output frequency $f_{out1}$ (V-f) curve of the VCO in FIG. 1, comprising curves ss, tt, and ff for three process corners. High gain $K_{VCO}$ is deployed so that the required frequency range from f1 to f2 can be covered for all process variation in FIG. 2. Unfortunately the high VCO gain $K_{VCO}$ also amplifies control voltage noise $n_c$, resulting in severer phase noise or jitter in output frequency $f_{out1}$.

Referring now to FIG. 1, the phase noise in output frequency $f_{out1}$ comprises control voltage noise $n_c$ at node n10 and local VCO noise $n_l$ at node n12. Control voltage noise $n_c$ includes charge pump noise $n_{CP}$ and power-ground noise $n_{PG}$, and is amplified by VCO gain $K_{VCO}$, contributing to the phase noise of output frequency $f_{out1}$. Local VCO noise $n_l$ includes VCO noise $n_{VCO}$ and power-ground noise $n_{PG}$, and is not amplified by VCO gain $K_{VCO}$. Control voltage noise $n_c$ contributes a major part in the phase noise of output frequency $f_{out1}$ due to the high VCO gain $K_{VCO}$, therefore reduction in control voltage noise $n_c$ improves the phase noise significantly. Power-ground noise $n_{PG}$ may be reduced through decoupling capacitors or shielding, leaving charge pump noise $n_{CP}$ as the dominant part in control voltage noise $n_c$. Charge pump noise $n_{CP}$ results from accumulative noise of circuit deficiency before node n10, including charge sharing, current mismatch, clock feedthrough, charge injection, reference signal spur, and current switching noise.

FIG. 3 shows control voltage $V_{c1}$ and output frequency $f_{out1}$ (V-f) curves of the VCO in FIG. 1 to reduce the phase noise, deploying low VCO gain $K_{VCO}$ and multiple V-f curves covering the frequency range from frequency f1 to frequency f2, as disclosed in "A CMOS self-Calibrating Frequency Synthesizer", IEEE journal of Solid State Circuits, Vol. 35, No. 10, October 2000, and "A 900-MHz 2.5-mA CMOS Frequency Synthesizer with an Automatic SC Tuning Loop", IEEE journal of Solid State Circuits, Vol. 36, No. 3, March 2001. VCO employing the approach in FIG. 3 determines a voltage range of control voltage $V_c$, and selects a corresponding V-f curve to produce corresponding output frequency $f_{out1}$. The phase noise of output frequency $f_{out1}$ is reduced by the low VCO gain $K_{VCO}$, at the expense of circuit complexity and manufacturing cost. Furthermore, the additional circuit complexity of VCO may contribute to higher VCO noise, directly associated with the phase noise of output frequency $f_{out1}$. Consequently the phase noise reduction in FIG. 3 is limited.

Thus a PLL in a clock distribution system that generates high-speed and low-noise clock is called for.

BRIEF SUMMARY OF THE INVENTION

A detailed description is given in the following embodiments with reference to the accompanying drawings.

According to the invention, a clock distribution circuit, comprises a comparator, a filter, a scaling unit, and an oscillator. The comparator compares a reference signal and a feedback signal to generate an error signal. The filter is coupled to the comparator and outputs a filtered signal based on the error signal. The scaling unit is coupled to the comparator, and scales down the filtered signal by a scaling factor to form a control signal. The oscillator is coupled to the scaling unit, and produces the feedback signal based on the control signal. The scaling factor is less than 1.

According to another embodiment of the invention, a method of clock distribution is also provided, comprising comparing a reference signal and a feedback signal to generate an error signal, outputting a filtered signal based on the error signal, scaling down the filtered signal with a scaling factor to form a control signal, and producing the feedback signal based on the control signal, wherein the scaling factor is less than 1.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
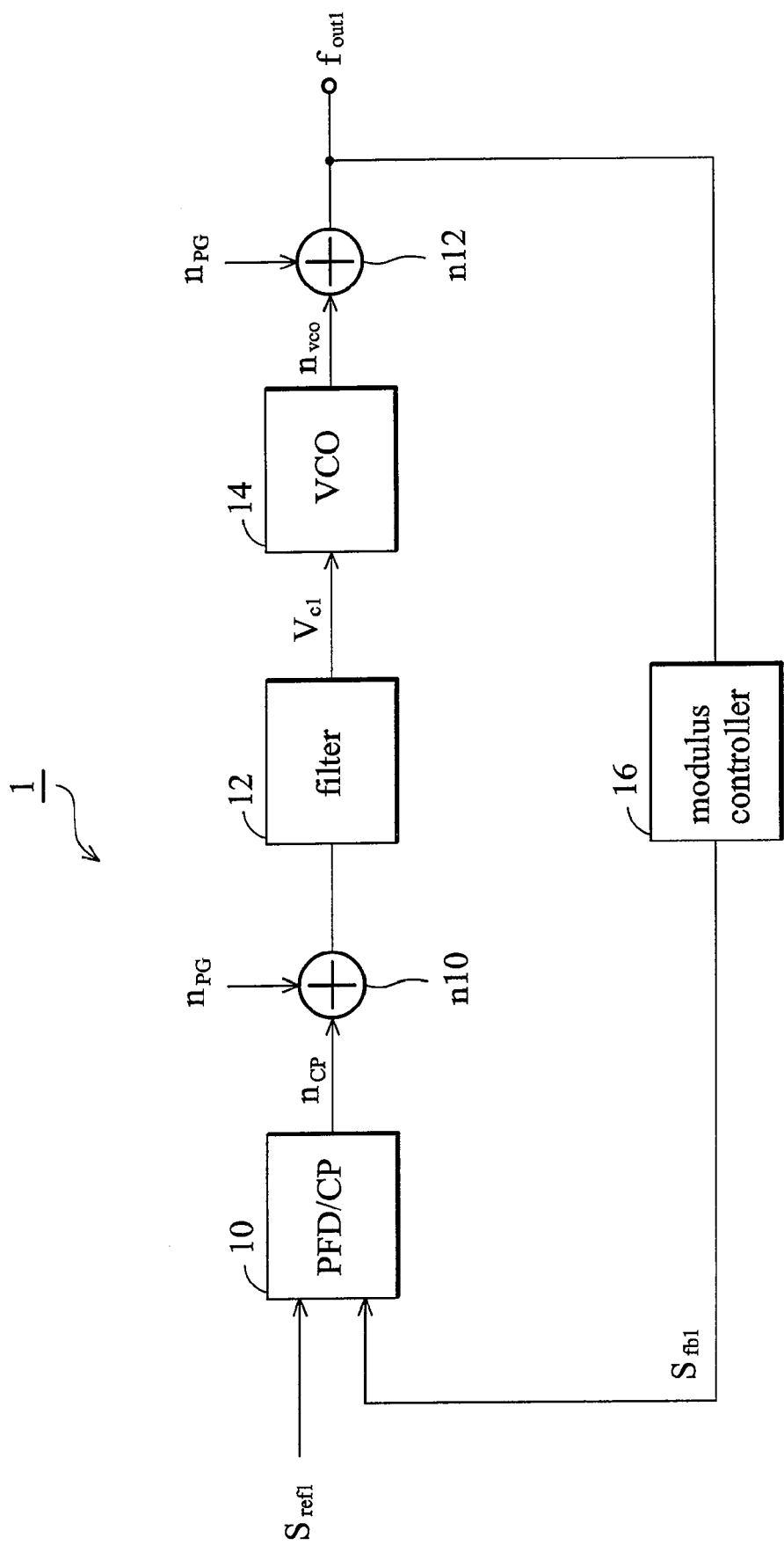
FIG. 1 is a block diagram of a conventional PLL with noise sources.
Figure 2:
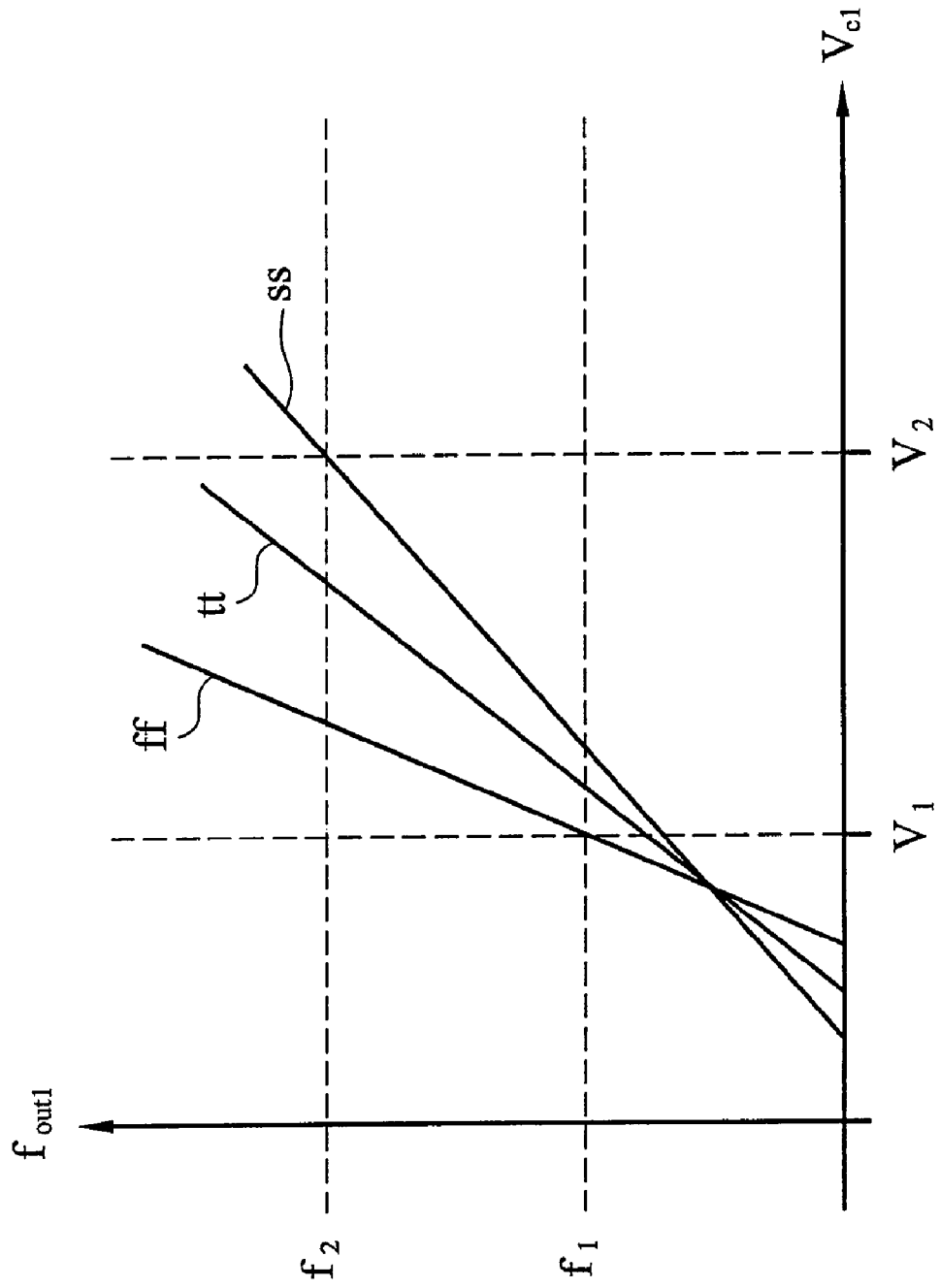
FIG. 2 shows a control voltage $V_{c1}$ and output frequency $f_{out1}$ curve of a VCO.
Figure 3:
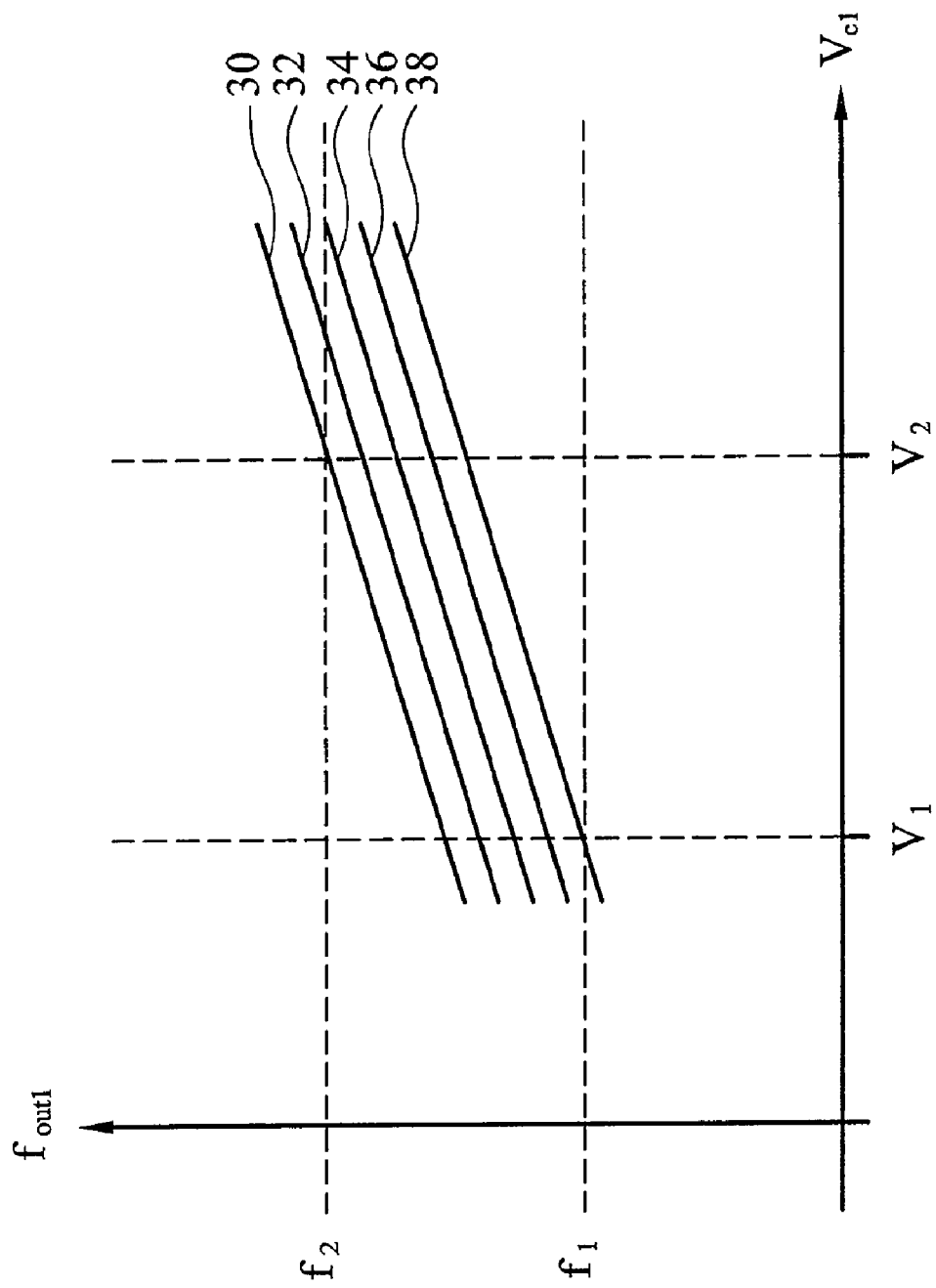
FIG. 3 shows control voltage $V_{c1}$ and output frequency $f_{out1}$ (V-f) curves of the VCO in FIG. 1.
Figure 4:
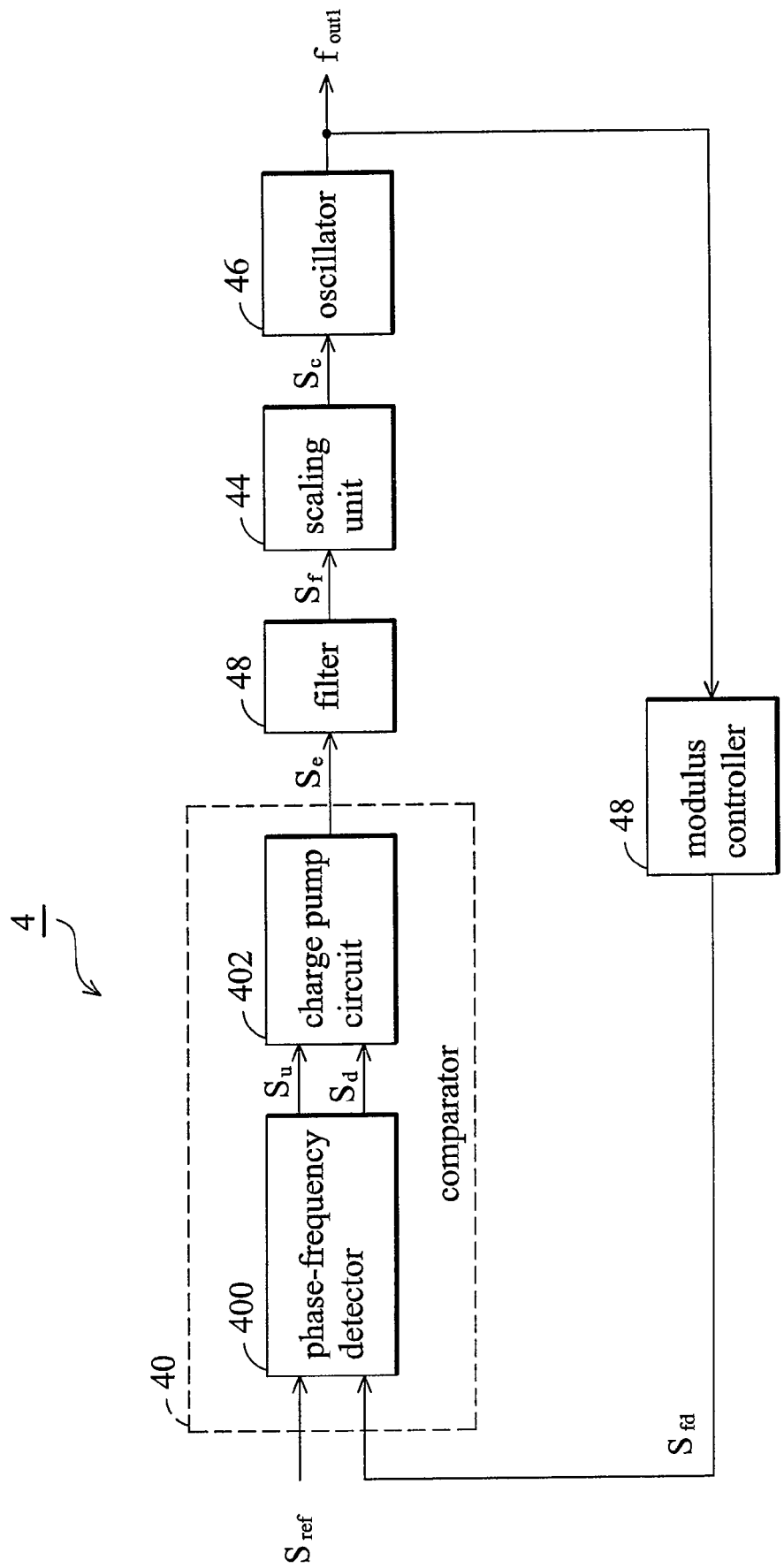
FIG. 4 is a block diagram of an exemplary PLL of the invention.

FIG. 4 is a block diagram of an exemplary PLL in a clock distribution circuit of the invention, comprising comparator 40, filter 42, scaling unit 44, oscillator 46, and modulus controller 48. Comparator 40 is coupled to filter 42, scaling unit 44, oscillator 46, modulus controller 48, and subsequently to comparator 40.

Comparator 40 compares reference signal $S_{ref}$ and feedback signal $S_{fb}$ to generate error signal $S_e$, and may comprise phase-frequency detector 400 and charge pump circuit 402 coupled thereto. Phase-frequency detector 400 receives reference signal $S_{ref}$ and feedback signal $S_{fb}$, compares phase and frequency difference therebetween to generate pulses at either signal $S_u$ or $S_d$, with width thereof equaling the phase difference. Phase-frequency detector generates signals $S_u$ and $S_d$ only if there is a phase difference between reference signal $S_{ref}$ and feedback signal $S_{fb}$. Charge pump circuit 402 obtains signals $S_u$ and $S_d$ to generate error signal $S_e$. Error signal $S_e$ may be a charging or discharging current signal.

Filter 42 may include one or more capacitors (not shown), accumulating charges therein to establish filtered signal $S_f$. In one embodiment, Filter 42 may include a resistor (not shown) connected in series with the one capacitor. Filter 42 outputs filtered signal $S_f$ to scaling unit 44 to be scaled down by scaling factor G to form control signal $S_c$, where the scaling factor G is less than 1. Since noise in filtered signal $S_f$ is reduced by scaling factor G, phase noise ϕ in output frequency $f_{out}$ is suppressed effectively.

Oscillator 46 may be a ring type oscillator, and may be a voltage controlled oscillator (VCO) or a current controlled oscillator (CCO). Oscillator 46 produces output frequency $f_{out}$ as a function of control signal $S_c$, and may be expressed as:

$$f_{out}=K_o*S_c \quad (1)$$

$$\phi=\int f_{out}dt \quad (2)$$

where $K_o$ is the gain of oscillator 46, and ϕ is phase noise of output frequency $f_{out}$. As the noise in control signal $S_c$ increases, output frequency $f_{out}$ increases accordingly, becomes, leading to increased phase noise ϕ as in formula (2).

Modulus controller 48 receives and divides output frequency $f_{out}$ by a division ratio M to output feedback signal $S_{fb}$ to comparator 40, such that when PLL 4 is locked feedback signal $S_{fb}$ and reference signal $S_{ref}$ have identical frequencies and phases.

Figure 5:
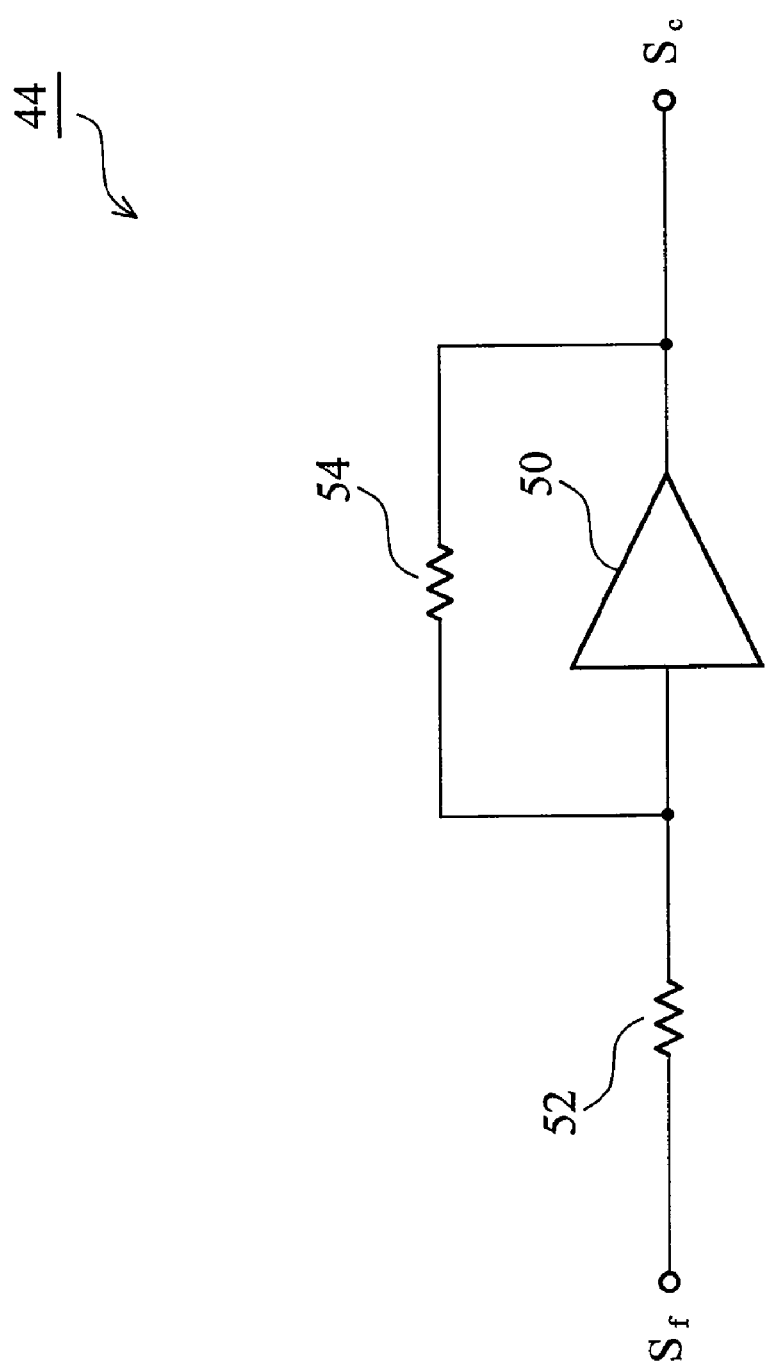
FIG. 5 is a schematic diagram of an exemplary V-V converter acting as the scaling unit in FIG. 4.

In one embodiment, scaling unit 44 and oscillator 46 are implemented in voltage domain. Scaling unit 44 is a voltage to voltage (V-V) converter and oscillator 46 is a voltage controlled oscillator. Scaling unit 44 obtains and scales down filtered voltage signal $S_f$ by the scaling factor G to provide a shrunk voltage signal as control signal $S_c$. The scaling factor G, less than 1, is determined by operating voltage ranges before and after scaling unit 44, i.e., operating voltage ranges of charge pump circuit 402 and oscillator 46. The scaling factor G may be selected by the ratio of the operating voltage range of charge pump circuit 402 to that of oscillator 46. Charge pump circuit 402 and filter 42 may be implemented by high-voltage devices and higher operating voltage range than that of oscillator 46 to reduce current leakage thereof, whereas oscillator 46 may be implemented by low-voltage devices and lower operating range to speed output frequency $f_{out}$. FIG. 5 is a schematic diagram of an exemplary V-V converter as scaling unit 44 in FIG. 4, comprising buffer 50, resistors 52 and 54. Resistor 52 is coupled to the input of buffer 50, and resistor 54 is coupled between the output and the input of buffer 50. Wherein the buffer 50 may be implemented in the filter 42 which is incorporated with resistors 52 and 54 as scaling unit 44. Buffer 50 may be an operational amplifier (OA) buffer. Scaling factor G is determined by ratio of resistors 54 to 52.

Figure 6:
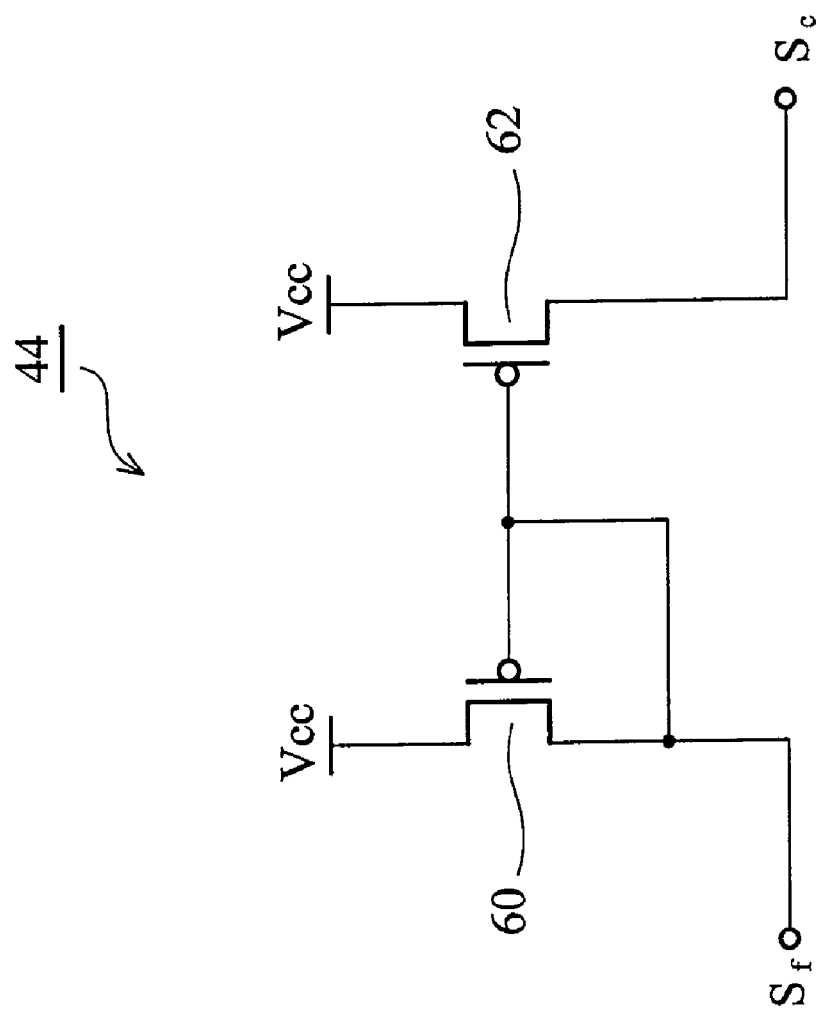
FIG. 6 is a schematic diagram of an exemplary I-I converter acting as the scaling unit in FIG. 4.
Figure 7:
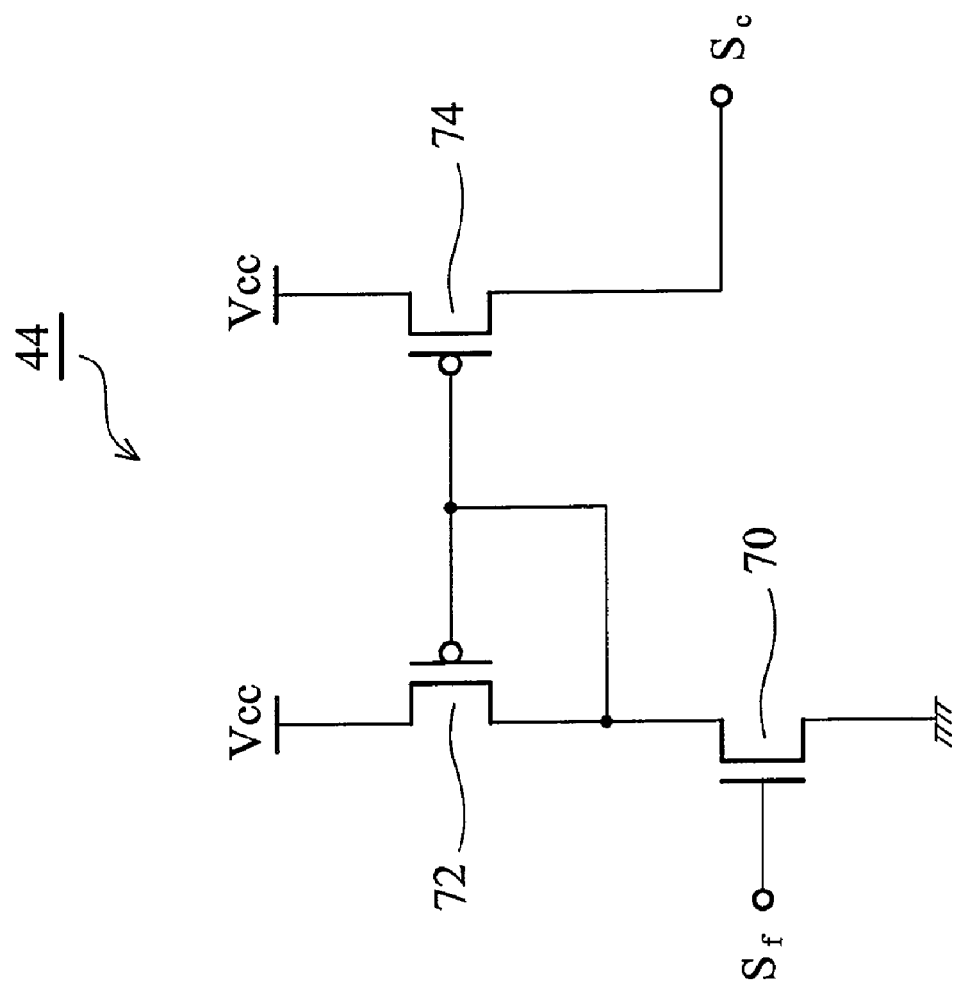
FIG. 7 is a schematic diagram of an exemplary V-I converter acting as the scaling unit in FIG. 4.

In another embodiment, scaling unit 44 and oscillator 46 are implemented in current domain. Scaling unit 44 may be a current to current (I-I) converter and oscillator 46 may be a current-controlled oscillator (CCO). Scaling unit 44 obtains and scales down filtered current signal $S_f$ to a reduced current signal as control signal $S_c$. Scaling unit 44 may be implemented by a current mirror circuit with scaling factor G. FIG. 6 is a schematic diagram of an exemplary I-I converter acting as scaling unit 44 in FIG. 4, comprising transistors 60 and 62 connected in current mirror configuration. Scaling factor G is less than 1 and is determined by an aspect ratio (Width/Length) of transistor 62 to that of transistor 60. Scaling unit 44 may also be a voltage to current (V-I) converter, converting and scaling down filtered voltage signal $S_f$ to a reduced current signal as control signal $S_c$. Scaling unit 44 may be realized by a voltage-controlled current source in conjunction with a current mirror circuit with scaling factor G. FIG. 7 is a schematic diagram of an exemplary V-I converter acting as scaling unit 44 in FIG. 4, comprising transistors 70, 72 and 74. Transistor 70 is coupled to transistor 72, and subsequently to transistor 74. Transistor 70 serves as a voltage-controlled current source and transistors 72 and 74 are connected as a current mirror with scaling factor G less than 1. Scaling factor G is determined by an aspect ratio (Width/Length) of transistor 74 to that of transistor 72.

Referring to FIG. 4, if a phase error occurs in PLL 4, the phase-frequency detector 400 generates a short train of pulses that drive charge pump circuit 402 to charge or discharge the one or more capacitors of filter 42. If the phase of feedback signal $S_{fb}$ lags behind that of reference signal $S_{ref}$, phase-frequency detector 400 produces a pulse at signal $S_u$, causing charge pump circuit 402 to charge the one or more capacitors of filter 42. Conversely, if the phase of feedback signal $S_{fb}$ leads reference signal $S_{ref}$, then phase-frequency detector 400 generates a pulse at signal $S_d$, leading charge pump circuit 402 to partially discharge current from the one or more capacitors of filter 42. The charges in filter 42 establish a voltage to be output to scaling unit 44. Scaling unit 44 scales down filtered signal $S_f$ by scaling factor G to produce control signal $S_c$, which adjusts oscillator 46 to produce output frequency $f_{out}$. Since noise in control signal $S_c$ is decreased by scaling factor G, phase noise ϕ of output frequency $f_{out}$ is effectively suppressed.

A method of clock distribution according to the invention is also provided, incorporating the PLL circuits in FIG. 4, FIG. 5, FIG. 6, and FIG. 7, comprising comparator 40 comparing reference signal $S_{ref}$ and feedback signal $S_{fb}$ to generate error signal $S_e$, filter 42 outputting filtered signal $S_f$ based on error signal $S_e$, scaling unit 44 scaling down filtered signal $S_f$ with scaling factor G to form control signal $S_c$, and oscillator 46 producing feedback signal $S_{fb}$ based on control signal $S_c$, wherein scaling factor G is less than 1.

In an embodiment, filtered signal $S_f$ and control signal $S_c$ are current signals, scaling unit 44 is a current to current (I-I) converter, and oscillator 46 is a current-controlled oscillator, the scaling step comprises a current mirror circuit of transistors 60 and 62 converting filtered signal $S_f$ to control signal $S_c$ with scaling factor G.

In another embodiment, filtered signal $S_f$ is a voltage signal and control signal $S_c$ is a current signal, scaling unit 44 is a voltage to current (V-I) converter, and oscillator 46 is a current-controlled oscillator, the scaling step comprises transistor 70 receiving filtered signal $S_f$ to output a first current, and a current mirror circuit of transistors 72 and 74 converting the first current to control signal $S_c$ with scaling factor G.

In yet another embodiment, filtered signal $S_f$ and control signal $S_c$ are voltage signals, scaling unit 44 is a voltage to voltage (V-V) converter, and oscillator 46 is a voltage-controlled oscillator, and scaling factor G is determined by a ratio of resistor 54 to resistor 52.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded to the broadest interpretation so as to encompass all such modifications and similar arrangements.

What is claimed is:

1. A clock distribution circuit, comprising:
    a comparator comparing a reference signal and a feedback signal to generate an error signal;
    a filter coupled to the comparator, outputting a filtered signal based on the error signal;
    a scaling unit coupled to the comparator, scaling down the filtered signal by a scaling factor to form a control signal, wherein the scaling factor is determined by a ratio of the control signal to the filtered signal and is less than 1; and
    an oscillator coupled to the scaling unit, producing the feedback signal based on the control signal;
    wherein the filtered signal and the control signal are both voltage signals or current signals.

2. The clock distribution circuit of claim 1, wherein the oscillator is a ring oscillator.

3. The clock distribution circuit of claim 1, wherein the filtered signal and the control signal are current signals, the scaling unit is a current to current (I-I) converter, and the oscillator is a current-controlled oscillator.

4. The clock distribution circuit of claim 3, wherein the I-I converter comprises a current mirror circuit converting the filtered signal to the control signal by the scaling factor.

5. The clock distribution circuit of claim 1, wherein the filtered signal is a voltage signal, the control signal is a voltage signal, the scaling unit is a voltage to voltage (V-V) converter, and the oscillator is a voltage-controlled oscillator.

6. The clock distribution circuit of claim 5, wherein the V-V converter comprises a buffer, a first resister and a second resistor, and the scaling factor is determined by a ratio of the second resistor to the first resistor.

7. The clock distribution circuit of claim 5, wherein the comparator comprises high-voltage devices and the voltage-controlled oscillator comprises low-voltage devices.

8. The clock distribution circuit of claim 5, wherein the scaling factor is dependent on the operating voltages of the comparator and the voltage-controlled oscillator.

9. A method of clock distribution, comprising:
    comparing a reference signal and a feedback signal to generate an error signal;
    outputting a filtered signal based on the error signal;
    scaling down the filtered signal with a scaling factor to form a control signal, wherein the scaling factor is determined by a ratio of the control signal to the filtered signal and is less than 1; and
    producing the feedback signal based on the control signal;
    wherein the filtered signal and the control signal are both voltage signals or current signals.

10. The method of claim 9, wherein the oscillator is a ring oscillator.

11. The method of claim 9, wherein the filtered signal is a current signal which is scaled down by a current to current (I-I) converter, and the control signal is a current signal which controls a current-controlled oscillator.

12. The method of claim 11, wherein the I-I converter comprises a current mirror circuit converting the filtered signal to the control signal by the scaling factor.

13. The method of claim 9, wherein the filtered signal is a voltage signal which is scaled down by a voltage to voltage (V-V) converter, and the control signal is a voltage signal which controls a voltage-controlled oscillator.

14. The method of claim 13, wherein the V-V converter comprises a buffer, a first resister and a second resistor, and the scaling factor is determined by a ratio of the second resistor to the first resistor.

15. The method of claim 13, wherein the comparator comprises high-voltage devices and the voltage-controlled oscillator comprises low-voltage devices.

16. The method of claim 13, wherein the scaling factor is dependent on the operating voltages of the comparator and the voltage-controlled oscillator.

17. A clock distribution circuit, comprising:
    a comparator comparing a reference signal and a feedback signal to generate an error signal;
    a filter coupled to the comparator, outputting a filtered voltage signal based on the error signal;
    a voltage to current (V-I) converter coupled to the comparator, scaling down the filtered voltage signal by a scaling factor to form a control current signal, wherein the scaling factor is less than 1; and
    a current-controlled oscillator coupled to the V-I converter, producing the feedback signal based on the control current signal;
    wherein the V-I converter comprises a voltage-controlled current source and a current mirror circuit coupled thereto, the voltage-controlled current source receives the filtered voltage signal to output a first current, and the current mirror circuit obtains and converts the first current to the control current signal by the scaling factor.

18. A method of clock distribution, comprising:
    comparing a reference signal and a feedback signal to generate an error signal;
    outputting a filtered voltage signal based on the error signal;
    scaling down the filtered voltage signal with a scaling factor with a voltage to current (V-I) converter to form a control current signal, wherein the scaling factor is less than 1; and
    producing the feedback signal based on the control current signal;
    wherein the V-I converter comprises a voltage-controlled current source and a current mirror circuit coupled thereto, the voltage-controlled current source receives the filtered voltage signal to output a first current, and the current mirror circuit obtains and converts the first current to the control current signal by the scaling factor.

* * * * *